United States Patent
Tanahashi et al.

(10) Patent No.: US 8,962,068 B2
(45) Date of Patent: Feb. 24, 2015

(54) METHOD OF MANUFACTURING ORGANIC ELECTROLUMINESCENCE ELEMENT AND MANUFACTURING APPARATUS

(75) Inventors: Kiyokazu Tanahashi, Tokyo (JP); Keiichi Aoki, Tokyo (JP); Yousuke Takashima, Tokyo (JP)

(73) Assignee: Konica Minolta Holdings, Inc., Tokyo (JP)

(*) Notice: Subject to any disclaimer, the term of this patent is extended or adjusted under 35 U.S.C. 154(b) by 1205 days.

(21) Appl. No.: 12/090,956

(22) PCT Filed: Sep. 29, 2006

(86) PCT No.: PCT/JP2006/319442
§ 371 (c)(1),
(2), (4) Date: Apr. 21, 2008

(87) PCT Pub. No.: WO2007/049427
PCT Pub. Date: May 3, 2007

(65) Prior Publication Data
US 2008/0226942 A1    Sep. 18, 2008

(30) Foreign Application Priority Data
Oct. 28, 2005    (JP) .................................. 2005-314238

(51) Int. Cl.
*B05D 7/00* (2006.01)
*H01L 51/56* (2006.01)
(Continued)

(52) U.S. Cl.
CPC ............ *H01L 51/56* (2013.01); *H01L 51/0003* (2013.01); *H05B 33/10* (2013.01)
USPC ........................................................ 427/64

(58) Field of Classification Search
USPC ........................................................ 427/64
See application file for complete search history.

(56) References Cited

U.S. PATENT DOCUMENTS

| 4,899,630 A | 2/1990 | Shioya |
| 6,293,270 B1 * | 9/2001 | Okazaki ..................... 125/13.01 |

(Continued)

FOREIGN PATENT DOCUMENTS

| JP | 11144713 | 5/1999 |
| JP | 2003012827 | 1/2003 |

(Continued)

OTHER PUBLICATIONS

Maehashi, JP 2005-067070, Machine Translation (Mar. 2005).*

(Continued)

*Primary Examiner* — Robert Vetere
(74) *Attorney, Agent, or Firm* — Lucas & Mercanti, LLP

(57) ABSTRACT

An objective is to provide a method of manufacturing an organic electroluminescence element possessing a thin film exhibiting relatively low film-strength formed via a continuous wet coating process. Disclosed is a method of manufacturing an organic electroluminescence element possessing a substrate film and provided thereon at least an organic layer placed between a pair of facing electrodes, possessing a light emitting layer containing an organic light emission material; possessing the steps of forming the organic layer on a first electrode provided on the substrate film by a continuous wet coating method; and cutting the substrate film with an upper cutting blade and a lower cutting blade, wherein the lower blade faces the substrate film, the upper blade has a blade edge angle of 30-60°, and the lower blade has a blade edge angle of 80-90°.

8 Claims, 2 Drawing Sheets

(51) Int. Cl.
*H01L 51/00* (2006.01)
*H05B 33/10* (2006.01)

(56) References Cited

U.S. PATENT DOCUMENTS

2001/0053082 A1* 12/2001 Chipalkatti et al. .......... 362/496
2002/0190640 A1* 12/2002 Tramontana .................. 313/506
2004/0135503 A1* 7/2004 Handa et al. ................. 313/511

FOREIGN PATENT DOCUMENTS

| JP | 2003332079 | 11/2003 |
| JP | 2004152746 | 5/2004 |
| JP | 2004247100 | 9/2004 |
| JP | 2005067070 | 3/2005 |
| JP | 2005126623 | 5/2005 |
| JP | 2005-212098 | 8/2005 |
| JP | 2005254381 | 9/2005 |
| JP | 2005313502 | 11/2005 |
| JP | 2006007404 | 1/2006 |

OTHER PUBLICATIONS

"Technical Data: Surface Roughness," JIS B 0601, 0031, 1994.*
Supplemental Partial European Search Report EP 06 81 0848.

* cited by examiner

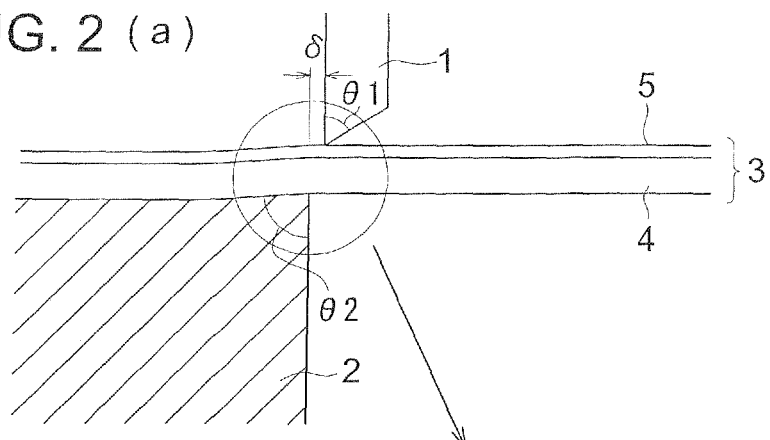
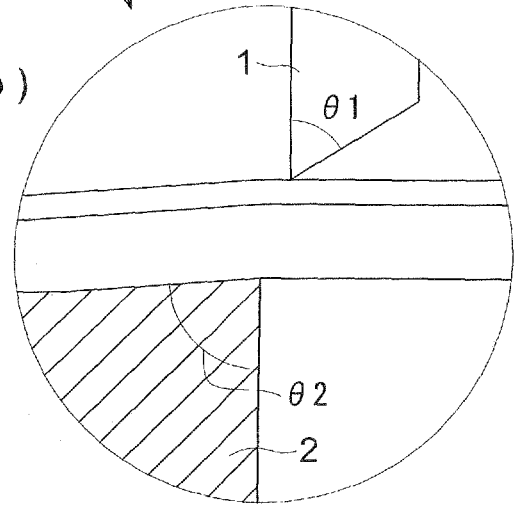
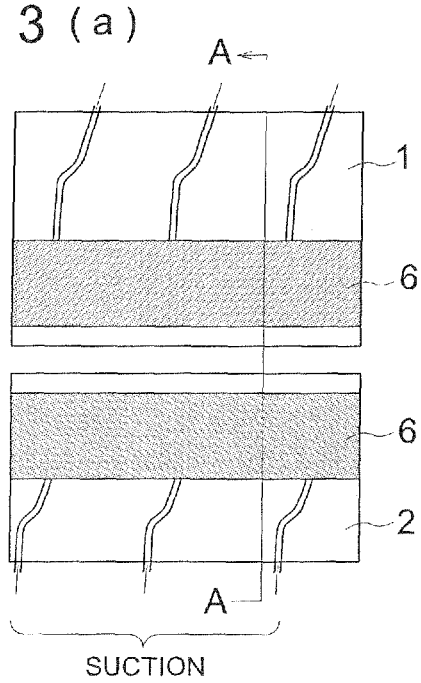
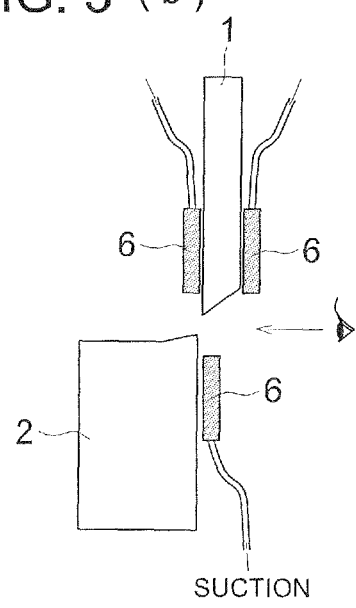

METHOD OF MANUFACTURING ORGANIC ELECTROLUMINESCENCE ELEMENT AND MANUFACTURING APPARATUS

This is a U.S. National Phase Application under 35 U.S.C. 371 of International Application PCT/JP2006/319442, filed on Sep. 29, 2006.

This Application claims the priority of Japanese Application No. 2005-314238, filed Oct. 28, 2005, the entire content of which is hereby incorporated by reference.

TECHNICAL FIELD

The present invention relates to a method of manufacturing an organic electroluminescence element utilized as a surface light source, a display or such, and specifically to a method to continuously produce an organic electroluminescence element from a roll material composed of a plastic film or the like.

BACKGROUND

As a light emitting type electronic display device, cited has been an electroluminescence display (ELD). Constituent elements of ELD include an inorganic electroluminescence element and an organic electroluminescence element (hereinafter also referred to as an organic EL element).

The organic electroluminescence element is constituted in such a manner that a light emitting layer, which incorporates light emitting compounds, is sandwiched between a cathode and an anode. In the above element, electrons and positive holes are injected into the light emitting layer and are subjected to recombination, whereby exciton is generated. During deactivation of the resulting exciton, light (fluorescence and phosphorescence) is emitted. Light emission can be realized via application of a voltage of approximately from several V to several tens V. Further, the organic electroluminescence element exhibits a wide viewing angle due to the self-light emitting type, and high visibility, whereby in view of space saving and portability, it has attracted attention.

A large-size manufacturing apparatus at high cost with a dry process such as an evaporation method or a sputtering method has been utilized as a method of manufacturing the organic electroluminescence element, but attention has been focused on a manufacturing method with a continuous wet coating process.

It has gradually been found out that a thin film formed via the dry process exhibits high film-strength though there is a problem such that the dry process produces high cost in view of productivity with low efficiency and so forth, whereas the surface of a thin film formed via the continuous wet coating process exhibits relatively low film-strength, and careful handling is desired since interlayer adhesion is weak further in the case of a multilayered film, though the continuous wet coating process exhibits excellent productivity. It has also been found out that attention should be paid specifically to a manufacturing method and a manufacturing apparatus during a cutting process.

Incidentally, a technique of cutting an organic EL element formed via the continuous wet coating process has not yet been disclosed.

DISCLOSURE OF THE INVENTION

Problems to be Solved by the Invention

It is an object of the present invention to provide a method of manufacturing an organic electroluminescence element possessing a thin film exhibiting relatively low film-strength formed via a continuous wet coating process as described above.

Means to Solve the Problems

The above-described object is accomplished by the following structures.

(Structure 1) A method of manufacturing an organic electroluminescence element comprising a substrate film and provided thereon at least an organic layer placed between a pair of facing electrodes, the organic layer comprising a light emitting layer containing an organic light emission material; the method comprising the steps of forming the organic layer on a first electrode provided on the substrate film by a continuous wet coating method; and cutting the substrate film with an upper cutting blade and a lower cutting blade, wherein the lower blade faces the substrate film, the upper blade has a blade edge angle of 30-60°, and the lower blade has a blade edge angle of 80-90°.

(Structure 2) A method of manufacturing an organic electroluminescence element comprising a substrate film and provided thereon at least an organic layer placed between a pair of facing electrodes, the organic layer comprising a light emitting layer containing an organic light emission material; the method comprising the steps of forming the organic layer on a first electrode provided on the substrate film by a continuous wet coating method; forming a second electrode on the organic layer; and cutting the substrate film with an upper cutting blade and a lower cutting blade, wherein the lower blade faces the substrate film, the upper blade has a blade edge angle of 30-60°, and the lower blade has a blade edge angle of 80-90°.

(Structure 3) The method of Structure 1 or 2, wherein the upper blade has a blade edge angle of 30-50°.

(Structure 4) The method of any one of Structures 1-3, wherein the upper cutting blade and the lower cutting blade each have a clearance of 80 μm or less.

(Structure 5) The method of any one of Structures 1-4, wherein the upper cutting blade and the lower cutting blade each have a surface roughness of 0.1 s or less.

(Structure 6) The method of any one of Structures 1-5, wherein each of the upper cutting blade and the lower cutting blade with the substrate film has a dynamic friction coefficient of 0.2 or less.

(Structure 7) The method of any one of Structures 1-6, comprising the step of suctioning cutting swarf via a suction mechanism.

(Structure 8) An apparatus of manufacturing the organic electroluminescence element, employed in the method of any one of Structures 1-7.

Effect of the Invention

In the present invention, provided can be a trouble-free organic electroluminescence element by which loss caused by peeling of a film and cutting failure is reduced in the manufacturing process.

DESCRIPTION OF THE DRAWINGS

FIG. 2(a) and FIG. 2(b) each are a schematic diagram showing cutting of an organic EL element material.

FIG. 3(a) and FIG. 3(b) each are a schematic diagram showing a suction mechanism to suction cutting swarf.

EXPLANATION OF NUMERALS

Figure 1:
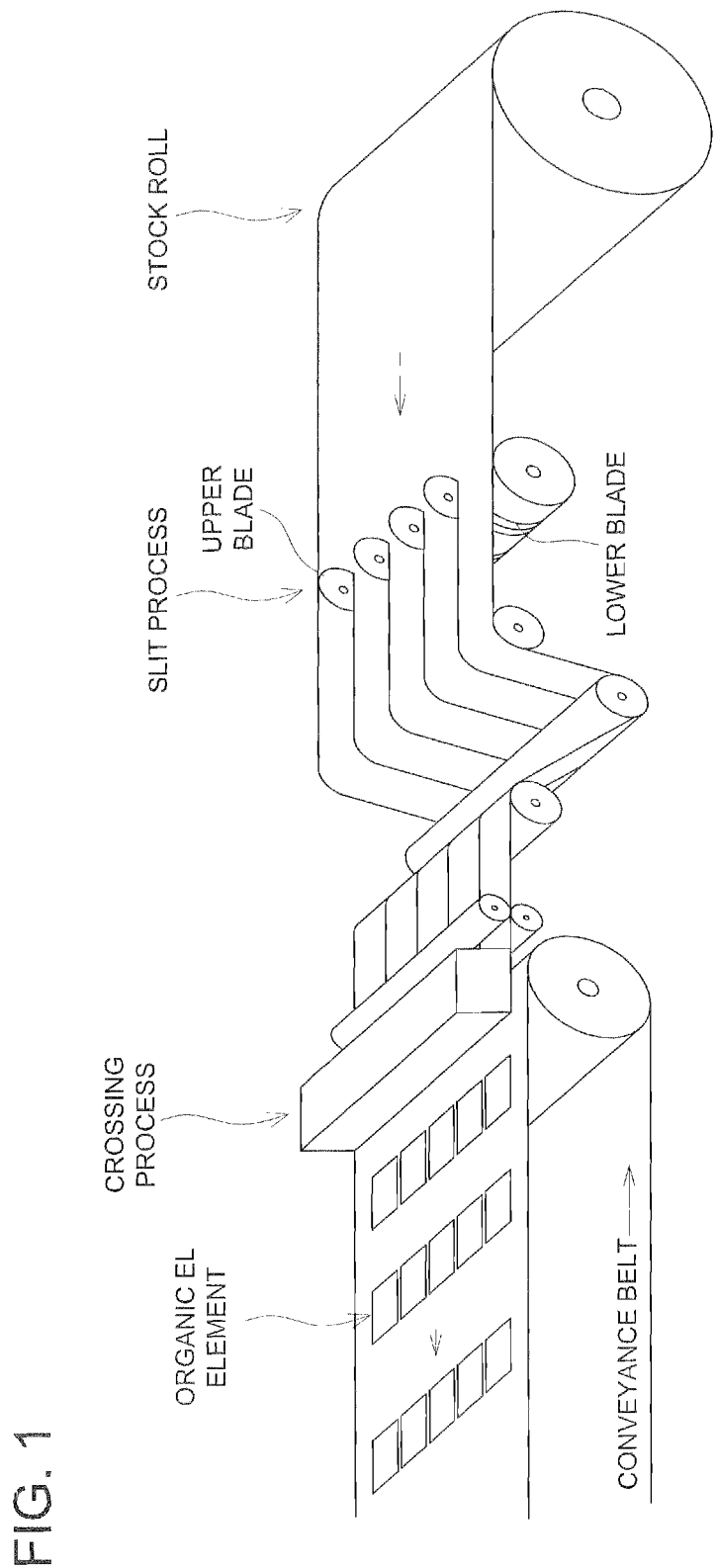
FIG. 1 is a schematic diagram showing a cutting process of an organic EL element in the present invention.

1 Upper blade
2 Lower blade
3 Organic EL element
4 Substrate film
5 Organic EL layer Description of the Preferred Embodiments Next, a method of an organic electroluminescence (organic EL) element of the present invention will be further described in detail.

The first electrode layer is formed on a substrate film rolled up in the form of a roll for an organic EL element formed via the manufacturing method of the present invention, an organic layer comprising a light emitting layer needs to be formed on the first electrode layer via a continuous wet coating method, and further, the second electrode layer may be formed thereon. It is a feature that an organic EL element is formed by cutting a long length organic EL element material formed in this way employing specific upper and lower blades.

Any method may be employed to form the first electrode layer and the second electrode layer, but in the present invention, similarly to formation of the organic layer, these first and second electrode layers are preferably formed by the continuous wet coating method in view of productivity.

FIG. 1 is a schematic diagram showing a cutting process of an organic EL element in the present invention.

A long length organic EL element material is rolled out from a stock roll, and slit by rotating blades composed of the upper blade and the lower blade of the present invention in a slit process. The long length organic EL element material having been subjected to slitting is further crossed by straight cutting blades composed of the upper blade and the lower blade of the present invention in a crossing process to produce sheet-fed organic EL element sheets. Further, a crossing process may be conducted after rolling it up once.

FIG. 2(a) and FIG. 2(b) each are a schematic diagram showing cutting of an organic EL element material. Numerals 1, 2 and 3 represent an upper blade, a lower blade and an organic EL element subjected to cutting, respectively.

FIG. 2(a) shows the entire structure, and FIG. 2(b) shows an enlarged view of the circled area in FIG. 2(a).

As a feature of the present invention, since substrate film 4 constituting organic EL element 3 has a thickness of 50 μm-several 100 μm, and the organic EL layer (first electrode layer, organic layer and second electrode layer) 5 has a very thin thickness of 1 μm or less, producing a weak multilayered structure, a high cutting technique is desired to be arranged.

As to cutting of the present invention, it is preferable that the lower blade faces the substrate film, and the upper blade faces the organic EL layer in order to conduct cutting. Because this means that no contact with the conveyance mechanism as much as possible is preferred since the resulting organic EL layer has a weak layer strength.

The lower blade preferably has a blade edge angle θ2 of 80-90°, and the upper blade preferably has a blade edge angle θ1 of 30-60°. Further, the upper blade more preferably has a blade edge angle θ1 of 30-50°.

The reason of designing the upper blade and the lower blade as described above is because not much of organic EL element slippage is caused during cutting, resulting in the blade cutting deep into, whereby the sharp fracture surface can be formed.

The shear force used during cutting of the substrate film can be minimized by making the blade edge angle smaller, whereby fine substrate cutting swarf generated from the cutting surface of the substrate film is possible to be controlled. However, in the case of the upper blade having a blade edge angle of less than 30°, substrate cutting swarf is generated from the substrate film since slight degradation of the blade edge is generated via repetitive cuttings. When the upper blade is designed to have a blade edge angle of 30-60°, it becomes possible that durability of the cutting blade is remarkably improved, generation of fine substrate cutting swarf from the cutting surface of the substrate film is markedly reduced, and further, generation of exfoliation of an organic layer formed on the substrate film is almost reduced.

The upper cutting blade and the lower cutting blade each preferably have a clearance δ of 80 μm or less, and more preferably have a clearance δ of 50 μm or less. Though there is no lower limit specifically, the upper cutting blade and the lower cutting blade each preferably have a clearance δ of 10 μm or more in view of durability of the blade edge.

In the present invention, the upper cutting blade and the lower cutting blade each preferably have a surface roughness of 0.1 s or less. The surface roughness of the cutting blade may be measured by a contact type or a non-contact type, but for example, can be measured by a contact type surface roughness measuring machine produced by Mitutoyo Corporation.

In the present invention, the upper cutting blade and the lower cutting blade each with the substrate film preferably have a dynamic friction coefficient of 0.2 or less. The dynamic friction coefficient between the cutting blade and the substrate film is measured under the following condition. The number of measurement is three times, and each measurement is conducted at a different portion to obtain an average value.

Load: 1 N
Scanning speed: 300 mm/min
Scanning plate: a plate having a square, 10 mm on a side, which is made of SUS
Measuring condition: at 23° C. and 48% RH Measured samples are to be measured after standing 2 hours under the above-described condition before measuring.

Measuring apparatus: a friction coefficient tester (produced by Toyo Seiki Seisaku-sho, Ltd.)

Since cutting swarf adhering to the surface of an organic electroluminescence element via generation of the cutting swarf around a cutting blade causes a trouble, a suction mechanism to suction the cutting swarf is preferably provide, and specifically, suction mechanism 6 as shown in FIGS. 3(a) and 3(b), for example, is preferably provided.

Next, an organic EL element material of the present invention will be described.

<<Organic Electroluminescence Layer>>

Preferable examples of the organic electroluminescence layer possessing at least one layer including a light emitting layer sandwiched between the first pixel electrode and the second pixel electrode in an organic EL element of the present invention include the following specific ones shown below, but the present invention is not limited thereto.

(i) Light emitting layer unit/Electron transport layer
(ii) Positive hole transport layer/Light emitting layer unit/Electron transport layer
(iii) Positive hole transport layer/Light emitting layer unit/Positive hole inhibition layer/Electron transport layer
(iV) Positive hole transport layer/Light emitting layer unit/Positive hole inhibition layer/Electron transport layer/Cathode buffer layer (V) Anode buffer layer/Positive hole transport layer/Light emitting layer unit/Positive hole inhibition layer/Electron transport layer/Cathode buffer layer Herein, a light emitting layer unit possesses at least one light emitting layer, and preferably possesses a non-luminous intermediate layer between light emitting layers in the case of the light emitting layer possessing plural light emitting layers.

In the present invention, each of these layers is formed by a continuous wet coating method.

As the continuous wet coating method, those employing a slide coater, a curtain coater, a die coater, a bar coater, a dip roll coater and so forth are usable, and various methods including an ink-jet method, a roller transfer method and so forth are also usable.

<<Substrate Film>>

A substrate film can be employed for an organic EL element of the present invention, provided that the film is a rigid resin film having a thickness of 70 μm, and of preferably at least 100 μm.

Examples of the resin film include polyester such as polyethylene terephthalate (PET) and polyethylenenaphthalate (PEN); cellulose esters such as polyethylene polypropylene, cellophane, cellulose diacetate, cellulose triacetate, cellulose acetate butyrate, cellulose acetate propionate (CAP), cellulose acetate phthalate (TAC), cellulose nitrate and so forth, or derivatives thereof; polyvinylidene chloride, polyvinyl alcohol, polyethylene vinyl alcohol, syndiotactic polystyrene, polycarbonate, a norbornane resin, poly methyl pentene, polyether ketone, polyimide, polyether sulfone (PES), polyphenylene sulfide, polysulfones, polyether imide, polyether ketone imide, polyamide, a fluororesin, nylon, polymethylmethacrylate, acryl or polyarylate series, and a cycloolefin based resin such as ARTON (produced by JSR corporation) or APEL (produced by Mitsui Chemicals Inc.).

In the case of a resin film, a barrier film made of the after-mentioned inorganic material or organic material is provided on the resin film surface, and the barrier film preferably has a water vapor permeance of 0.01 g/(m$^2$·day) or less at 25° C.±0.5° C. and 90%±2% RH, measured in accordance with JIS K 7129-1992. Further, the high barrier film preferably has an oxygen permeance of $10^{-3}$ ml/(m$^2$·day·MPa) or less and a water vapor permeance of $10^{-3}$ g/m$^2$/day or less, measured in accordance with JIS K 7126-1987, and more preferably has an oxygen permeance of $10^{-5}$ ml/(m$^2$·day) or less and a water vapor permeance of $10^{-5}$ g/(m$^2$·day) or less.

<<First Electrode: Anode>>

Metal, alloy, an electrically conductive compound and mixtures thereof each having a large work function of at least 4 eV are preferably used as the electrode material for an organic EL element. Specific examples of the electrode material include metal such as Au or the like, CuI, indium tin oxide (ITO), SnO$_2$, ZnO and so forth as conductive transparent materials. Materials such as IDIXO (In$_2$O$_3$—ZnO) and so forth capable of preparing an amorphous transparent conductive layer may also be used. A thin film is formed with electrode material for an anode via an evaporation or sputtering method, then a desired shape pattern may be formed by a photolithography method, or in the case of a rough patterning accuracy of approximately at least 100 μm, a pattern may be formed via a mask of desired shape during evaporation or sputtering of the above-described electrode material. Further, in the case of use of a coatable material like an organic conductive compound, a wet film-forming method such as a printing method or a coating method is also usable. In order to take light emission out of this anode, transmittance is preferably designed to be larger than 10%, and sheet resistance as an anode is preferably designed to be approximately several hundred ohms/□ or less. Further, the film conventionally has a thickness of 10-1000 nm, and preferably has a thickness of 10-200 nm, depending on the materials.

<Second Electrode: Cathode>>

On the other hand, metal (called electron-injection metal), alloy, an electrically conductive compound and mixtures thereof each having a small working function of 4 eV or less are preferably used as the electrode material for the cathode. Specific examples of such the electrode material include sodium, sodium-potassium alloy, magnesium, lithium, a magnesium/copper mixture, a magnesium/silver mixture, a magnesium/aluminum mixture, a magnesium/indium mixture, an aluminum/aluminum oxide (Al$_2$O$_3$) mixture, indium, a lithium/aluminum mixture, rare-earth metal and so forth.

<<Method of Preparing Organic EL Element>>

A method of preparing an organic EL element composed of anode/light emitting layer/cathode will be described as an example of the method of preparing an organic EL element.

First, a thin film made of a material for an anode as a desired electrode material, for example, is formed on a suitable long-length substrate film so as to give a thin film thickness of 1 μm or less, or preferably a thin film thickness of 10-200 nm by a coating method, an evaporation method or a sputtering method to prepare an anode.

Next, a coating solution of an organic compound for a light emitting layer as an organic EL element material is coated thereon, and subsequently dried to prepare a thin film.

As the film-forming method of this organic compound thin film, a wet process as described before such as a casting method, an ink-jet method, a printing method and so forth can be applied, and the ink-jet method and the printing method are specifically preferable since a uniform layer is possible to be easily obtained and pin holes are difficult to be formed.

After forming the layer, a thin film made of a material for a cathode is formed thereon so as to give a thickness of 1 μm or less, but preferably a thickness of 50-200 nm by a coating method, an evaporation method or a sputtering method to obtain a desired organic EL element by providing the cathode. The preparation of this organic EL element is preferable since productivity is further improved by preferably employing a wet coating method applied for any of an electrode layer and an organic layer.

<<Application>>

The organic EL element of the present invention can be utilized for a displaying device, a display and various light emission sources, but the manufacturing method of the present invention is preferably applied for a light emission source in which an evenly coated large area produces luminescence. Examples of the light emission source include domestic light, room light in car, backlight for a watch and a liquid crystal display, an advertisement signboard, a signal apparatus, a light source for optical memory, a light source for an electrophotographic copier, a light source for an optical communication device and a light sources for a photo sensor, but the application is not limited thereto. However, a back light of a liquid crystal display device in combination with a color filter and a light source for lighting are specifically utilized effectively.

EXAMPLE

A method of manufacturing an organic EL element composed of anode/positive hole transport layer/light emitting layer unit/electron transport layer/cathode will be described as an example of the preparation method of the organic EL element in the present invention.

<Substrate Film>

Prepared was a transparent gas barrier film in which a gas barrier layer was laminated on a polyethylene terephthalate film having a substrate width of 500 mm and a thickness of 100 μm as a substrate (also abbreviated to PET), produced by Teijin DuPont Films Japan Ltd., employing an atmospheric pressure plasma discharge treatment apparatus.

Next, ITO (indium tin oxide) was deposited 120 nm thick on the gas barrier substrate film, and patterning was conducted to form the first pixel electrode.

<Formation of Positive Hole Transport Layer>

A rolled belt type flexible sheet, on which the first pixel electrode is formed, is unrolled, and a surface electrification-removing treatment is conducted. Then, the following positive hole transport layer is coated and dried, and is subsequently heat-treated to roll it up in the form of a roll.

A solvent in which polyethylene dioxythiophene polystyrene sulfonate aqueous dispersion (PEDOT/PSS, Bytron P AI 4083, produced by Bayer AG.) is diluted with 65% of an aqueous methanol solution to make a concentration of 5% was coated by a die coating method so as to give a dry thickness of 50 nm to prepare a positive hole transport layer.

<Formation of Light Emitting Layer>

[Coater]

A light emitting layer was formed employing an ink-jet recording apparatus.

A light emitting layer is coated in total width of W=450 mm in such a way that a light emitting layer pattern film is formed on a positive hole transport layer on a polyethylene terephthalate (hereinafter, simply abbreviated to PET) film as PET on which the above-described ITO electrode and positive hole transport layer are formed.

As for a light emitting layer, a 1:1:1 mixture of Ir(ppy)$_3$, FIr(pic) and btp$_2$Ir(acac) as a dopant material was mixed in polyvinyl carbazole (PVK) as a host material so as to give 10% by weight, and dissolved in 1,2-dichloroethane to make a 1% by weight solution in solid content. The resulting solution was coated on the first positive hole transport layer to form a layer so as to give a dry thickness of 100 nm employing an ink-jet method, and a light emitting layer was formed.

Subsequently, drying was conducted at 60° C. employing the same drying oven as for a positive injection transfer layer to continuously conduct a heat treatment at 100° C.

Chemical structure formulae of the utilized dopant material are shown below.

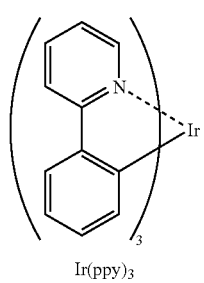

Ir(ppy)$_3$

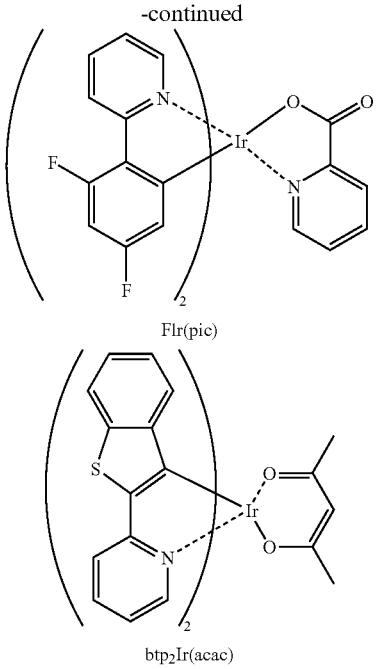

FIr(pic)

btp$_2$Ir(acac)

<Formation of Electron Transfer Layer, Cathode and Sealing Layer>

After forming the foregoing light emitting layer, a LiF layer having a thickness of 0.5 nm was prepared in the organic EL layer forming region on the above-described film in the form of the resulting roll via evaporation under a vacuum condition of 5×10$^{-4}$ Pa. Next, similarly, an aluminum layer having a thickness of 100 nm was also evaporated onto a region including an organic EL layer region and an electrode exposure region to form these layers in order, and a 30 nm thick inorganic SiO$_x$ layer was subsequently formed as a sealing layer in a region except the electrode region by a sputtering method to roll up the resulting.

Next, after the above-described roll-up roll was unrolled under inert gas, and a UV curable epoxy resin (UV resin XNR5570-B1, produced by Nagase Chemtex Corporation) as a sealing adhesive was coated onto the portion except electrode terminal portions by a dye coater, and a resin film exhibiting a gas barrier property was pressure-attached, the resulting was exposed to a UV lamp from the cathode side to conduct adhesion of the resin film.

After sealing via adhesion, continuous roll-up was conducted, and slit-cutting and cross-cutting were subsequently conducted under the following condition to prepare a panel.

<Cutting Condition>

Slit cutting was conducted employing a cutting apparatus shown in FIG. 1.

<Slit>

Upper blade (blade edge angle θ1): 30°

Lower blade (blade edge angle θ2): 85°

Clearance (δ): 30 μm

Surface roughness: 0.1 s

Dynamic friction coefficient: 0.2

Suction mechanism: provided

With respect to the above-described basic condition, the slit cutting condition is further changed as described in Table 1.

TABLE 1

| Cutting condition | Upper blade | Lower blade | Clearance | Surface roughness | Dynamic friction coefficient |
|---|---|---|---|---|---|
| 1-1 | 45° | 85° | 30 μm | 0.1 s | 0.25 |
| 1-2 | 45° | 85° | 30 μm | 0.1 s | 0.2 |
| 1-3 | 45° | 85° | 30 μm | 0.15 s | 0.2 |
| 1-4 | 45° | 85° | 100 μm | 0.1 s | 0.2 |
| 1-5 | 45° | 90° | 30 μm | 0.1 s | 0.2 |
| 1-6 | 45° | 95° | 30 μm | 0.1 s | 0.2 |
| 1-7 | 45° | 80° | 30 μm | 0.1 s | 0.2 |
| 1-8 | 45° | 75° | 30 μm | 0.1 s | 0.2 |
| 1-9 | 60° | 85° | 30 μm | 0.1 s | 0.2 |
| 1-10 | 65° | 85° | 30 μm | 0.1 s | 0.2 |
| 1-11 | 30° | 85° | 30 μm | 0.1 s | 0.2 |
| 1-12 | 25° | 85° | 30 μm | 0.1 s | 0.2 |

[Evaluation]

Organic layer exfoliation, interlayer peeling and lifted edge were evaluated with an optical microscope, and whether substrate cutting swarf was generated or not was visually evaluated.

<Organic Layer Exfoliation>
A: No organic layer exfoliation was observed.
B: Organic layer exfoliation was observed.
<Interlayer Peeling>
A: No interlayer peeling was observed.
B: Interlayer peeling was observed.
<Lifted Edge>
A: No lifted edge was observed.
B: Lifted edge was observed.
<Generation of Substrate Cutting Swarf>
A: No substrate cutting swarf was observed.
B: Substrate cutting swarf was observed.

Evaluated results obtained under each of the cutting conditions are shown in Table 2.

TABLE 2

| Cutting condition | Interlayer peeling | Organic layer exfoliation | Generation of substrate cutting swarf | Lifted edge | Remarks |
|---|---|---|---|---|---|
| 1-1 | B | B | A | A | Inv. |
| 1-2 | A | A | A | A | Inv. |
| 1-3 | B | B | A | A | Inv. |
| 1-4 | B | B | A | A | Inv. |
| 1-5 | A | A | A | A | Inv. |
| 1-6 | B | B | B | B | Comp. |
| 1-7 | A | A | A | A | Inv. |
| 1-8 | B | B | B | A | Comp. |
| 1-9 | A | A | A | A | Inv. |
| 1-10 | B | B | A | B | Comp. |
| 1-11 | A | A | A | A | Inv. |
| 1-12 | B | B | B | B | Comp. |

Inv.: Present invention
Comp.: Comparative example

In the case of an upper blade edge angle θ1 of less than 30° (cutting condition: 1-12), the blade edge was chipped off because of cutting resistance generated with the substrate during cutting, whereby the organic layer exfoliation, the interlayer peeling and the substrate cutting swarf were generated during cutting. In the case of an upper blade edge angle exceeding 60° (cutting condition: 1-10), the fine slippage with a substrate was caused during cutting, whereby interlayer peeling was generated.

In the case of a lower blade edge angle θ2 of less than 80° (cutting condition: 1-8), the fracture surface of a substrate is roughened, and substrate cutting swarf is generated since compression fracture is caused in the substrate by conducting cutting from the lower blade side. Further, in the case of a lower blade edge angle exceeding 90° (cutting condition: 1-6), a substrate is deformed when the upper blade cuts deep into the substrate, and the area around the blade edge is lifted up during cutting, whereby the layer thickness becomes uneven.

In the case of a clearance exceeding 80 μm (cutting condition: 1-4), a substrate is deformed since the upper blade can not cut deep into the substrate smoothly, so that organic layer exfoliation and interlayer peeling are easily generated.

In the case of a surface roughness exceeding 0.1 s (cutting condition: 1-4), cutting resistance generated with the substrate during cutting is increased, whereby organic layer exfoliation and interlayer peeling are generated.

In the case of a dynamic friction coefficient exceeding 0.2 (cutting condition: 1-1), cutting resistance generated with the substrate during cutting is increased, whereby organic layer exfoliation and interlayer peeling are generated.

The resulting organic electroluminescence element is possible to be utilized as a lighting device, and an apparatus of manufacturing the lighting device exhibiting high productivity at low cost can be provided.

What is claimed is:

1. A method of manufacturing an organic electroluminescence element comprising a substrate film and provided thereon at least an organic layer placed between a pair of facing electrodes, the organic layer comprising a light emitting layer containing an organic light emission material; the method comprising the steps of:
    forming the organic layer on a first electrode provided on the substrate film by a continuous wet coating method; and
    cutting the organic electroluminescence element with an upper cutting blade and a lower cutting blade,
    wherein the upper cutting blade opposes the lower cutting blade, and the lower blade faces the substrate film,
    wherein the upper blade has a blade edge angle of 30-60°,
    wherein the lower blade has a blade edge angle of 80-90°,
    wherein the upper cutting blade and the lower cutting blade each have a surface roughness of 0.1 s or less,
    wherein a total thickness of the at least an organic layer and the pair of facing electrodes is 1 μm or less,
    wherein the upper cutting blade and the lower cutting blade each have a clearance of 80 μm or less, and
    wherein each of the upper cutting blade and the lower cutting blade with the substrate film had a dynamic friction coefficient of 0.2 or less.

2. The method of claim 1,
    wherein the upper blade has a blade edge angle of 30-50°.

3. The method of claim 1, comprising the step of:
    suctioning cutting swarf via a suction mechanism.

4. The method of claim 1,
    wherein the upper cutting blade and the lower cutting blade each have a clearance of 80 μm to 10 μm.

5. A method of manufacturing an organic electroluminescence element comprising a substrate film and provided thereon at least an organic layer placed between a pair of facing electrodes, the organic layer comprising a light emitting layer containing an organic light emission material; the method comprising the steps of
    forming the organic layer on a first electrode provided on the substrate film by a continuous wet coating method;
    forming a second electrode on the organic layer; and
    cutting the organic electroluminescence element with an upper cutting blade and a lower cutting blade, wherein the upper cutting blade opposes the lower cutting blade, and the lower blade faces the substrate film, wherein the upper blade has a blade edge angle of 30-60°, wherein the lower blade has a blade edge angle of 80-90°, wherein the upper cutting blade and the lower cutting blade each have a surface roughness of 0.1 s or less, wherein a total thickness of the at least an organic layer and the pair of facing electrodes is 1 μm or less, wherein the upper cutting blade and the lower cutting blade each have a clearance of 80 μm or less, and wherein each of the upper cutting blade and the lower cutting blade with the substrate film has a dynamic friction coefficient of 0.2 or less.

6. The method of claim 5, wherein the upper blade has a blade edge angle of 30-50°.

7. The method of claim 5, comprising the step of:

suctioning cutting swarf via a suction mechanism.

8. The method of claim 5, wherein the upper cutting blade and the lower cutting blade each have a clearance of 80 μm to 10 μm.

* * * * *